(12) United States Patent
Collins et al.

(10) Patent No.: US 6,252,354 B1
(45) Date of Patent: *Jun. 26, 2001

(54) RF TUNING METHOD FOR AN RF PLASMA REACTOR USING FREQUENCY SERVOING AND POWER, VOLTAGE, CURRENT OR DI/DT CONTROL

(75) Inventors: Kenneth Collins; Craig Roderick, both of San Jose; Douglas Buchberger, Tracy; John Trow, San Jose; Viktor Shel, Dublin, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/743,059

(22) Filed: Nov. 4, 1996

(51) Int. Cl.[7] .................................................. H05H 1/46
(52) U.S. Cl. ................................... 315/111.51; 333/17.3; 118/723 I; 156/345
(58) Field of Search ...................... 333/17.3; 315/111.21, 315/111.51; 118/723 I, 723 IR; 156/345, 345 C

(56) References Cited

U.S. PATENT DOCUMENTS

| 4,621,242 | * | 11/1986 | Theal, Jr. et al. | 333/17.3 |
| 5,565,737 | * | 10/1996 | Keane | 315/111.21 |
| 5,667,701 | * | 9/1997 | Sato et al. | 156/345 C |
| 5,683,539 | * | 11/1997 | Qian | 118/723 IR |
| 5,688,357 | * | 11/1997 | Hanawa | 156/345 C |
| 5,815,047 | * | 9/1998 | Sorensen et al. | 333/17.3 |

* cited by examiner

*Primary Examiner*—Justin P. Bettendorf
(74) *Attorney, Agent, or Firm*—Michaelson and Wallace; Robert Wallace

(57) ABSTRACT

In an RF plasma reactor including a reactor chamber with a process gas inlet, a workpiece support, an RF signal applicator facing a portion of the interior of the chamber and an RF signal generator having a controllable RF frequency and an RF signal output coupled to an input of the RF signal applicator, the invention tunes the RF signal generator to the plasma-loaded RF signal applicator by sensing an RF parameter at the RF signal generator or at the RF signal applicator and then adjusting the frequency of the RF signal generator so as to optimize the parameter. The invention further controls the RF signal generator output magnitude (power, current or voltage) by optimizing the value of the same RF parameter or another RF parameter. The reactor preferably includes a fixed tuning circuit between the RF signal generator and the RF signal applicator.

72 Claims, 10 Drawing Sheets

RF TUNING METHOD FOR AN RF PLASMA REACTOR USING FREQUENCY SERVOING AND POWER, VOLTAGE, CURRENT OR DI/DT CONTROL

BACKGROUND OF THE INVENTION

1. Technical Field

The invention concerns tuning an RF signal generator to a plasma-loaded RF signal applicator of a plasma reactor, such as an antenna or an electrode, by serving the RF frequency so as to optimize the value of a selected parameter, such as, for example, delivered current or voltage or power, using a fixed tuning circuit. The fixed tuning circuit may be switched to a selected one of several transformers, depending upon the tuning range anticipated.

2. Background Art

RF plasma reactors of the type employed in processing semiconductor wafers require a large amount of RF power to maintain a plasma within a vacuum chamber, typically on the order of a thousand watts at RF frequencies on the order of several megaHertz. To maintain a high density plasma, the RF power is best inductively coupled into the chamber via an overlying coil antenna, while plasma ion energy can be controlled by controlling the voltage on the semiconductor wafer being processed. Typically, the RF signal source is an RF generator having an output impedance of 50 Ω with substantially no reactance. The input impedance presented by the plasma-loaded coil antenna is typically not 50 Ω and has substantial reactance, so that there is a substantial impedance mismatch. For example, the coil antenna typically has a length much less than a quarter wavelength of the RF signal, so that the coil antenna presents an impedance having a real part much less than that of the RF generator (which is typically 50 Ω) and having a very high inductive reactance. Such a mismatch causes RF power to be wasted by reflection back to the RF generator rather than being delivered to the plasma, so that it is difficult to control the amount of RF power delivered to the plasma. As a result, process control is compromised. One solution to this problem is to provide a fixed RF match circuit having lumped reactive elements so as to maintain a zero phase angle between RF voltage and current. Moreover, optionally a transformer can be employed to provide a match between the output and input impedance magnitudes.

The problem with such a fixed match circuit is that the input impedance of the plasma-loaded coil antenna changes as process conditions inside the reactor chamber change. Thus, as changes in plasma conditions change the plasma-loaded antenna impedance, the match circuit no longer can perform its function, and RF power delivered to the plasma falls off. Such a reduction in delivered RF power typically distorts the plasma processing of the wafer and in many cases is unacceptable. Therefore, the best solution in the art is to provide an RF impedance matching apparatus that adjusts the impedance match in response to changes in the plasma-loaded impedance of the antenna.

A conventional plasma reactor having such a variable RF impedance match circuit is depicted in FIG. 1A. The plasma reactor includes a reactor chamber 100 evacuated by a pump 105, a wafer support pedestal 110 on which a wafer 115 may be placed, an overhead coil antenna 120, and a gas inlet 125 into the chamber coupled to a process gas supply 130. An RF plasma source signal generator 140 is connected through an RF impedance match box 150 while an RF bias signal generator 160 is connected through another RF impedance match box 170 to the wafer pedestal 110. The power applied by the plasma source signal generator 140 controls plasma ion density in the chamber 100 while the power applied by the bias signal generator 160 controls plasma ion energy near the wafer 115. In some cases, both ends of the coil 120 may be connected to ground through respective capacitors shown in dashed line in FIG. 1A.

The RF impedance match boxes 150 and 170 are generally the same and will be described with reference to the RF impedance match box 150. The impedance match is provided by a conventional "pi-network" consisting of a pair of parallel capacitors 180, 185 (which are really capacitor circuits) on either side of a series inductor 190. Each of the capacitor circuits 180, 185 is controlled by an impedance match controller 200. The controller 200 monitors the forward voltage, reverse voltage and current/voltage phase angle via a conventional directional coupler 210 at the RF input 150a and computes from these three parameters a correction to the capacitance of each variable capacitor circuit 180, 185, using a network model 220. The controller 200 issues control signals at its control outputs 200a, 200b to the variable capacitors 180, 185 to effect the needed corrections in their capacitance values. Each of the variable capacitors 180, 185 can be a mechanically variable capacitor or an electrically variable capacitor circuit as illustrated in the drawing, the latter choice being preferable. FIG. 1A illustrates one example of the latter case, in which each variable capacitor circuit 180, 185 consists of an electrically variable inductor 230 connected in parallel with a fixed capacitor 240. The variable inductor 230 is a saturable reactor consisting of a primary winding 232, a magnetically permeable core 234 and a smaller control winding 236 connected to a variable current source 238. A respective one of the control outputs 200a, 200b is connected to an input of the current source 238. The controller 200 can decrease the capacitance of the variable capacitor 180 by increasing the D.C. or low frequency current through the control winding 236. This in turn reduces the permeability of the core 230 (by inhibiting the magnetic domains in the core from following the field fluctuations in the primary winding 232) and hence reduces the inductance presented by the primary winding 232, thereby decreasing the predominance of the capacitive reactance presented by the fixed capacitor 180 over the inductive reactance. Such a change represents an effective decrease in capacitance of the variable capacitor 180. The reverse process produces an increase in capacitance.

One disadvantage of such a device is that it requires a measurement of the forward and reflected voltages and the phase therebetween, or a measurement of the current and voltage and the phase therebetween. Another disadvantage is that it is bulky and costly. Another more important disadvantage is that there are hysteresis losses in each core 234 that vary as the load impedance varies. Referring to FIG. 1B, as the applied magnetic field H (from the control winding 236) increases and then decreases, the induced magnetic field B that fixes the polarization of the core magnetic domains changes at different rates so that there is a net loss of energy with each cycle of the induced field. Referring to FIG. 1C, the complex impedance plane of the match network includes a tuning space 300 within which the impedance match controller provides a theoretically exact solution to the impedance matching problem. Assuming the signal generator output impedance is a purely resistive 50 Ω, if the controller 200 commands a higher control current through the control winding 236, it moves the impedance presented by the pi-network 180, 185, 190 to a lower impedance in the region 310 of the control space. In this case the magnetic core 234 fluctuates near the origin of the hysteresis loop of FIG. 1B and the losses are slight. If on the other hand the controller 200 commands a lower control current, the resulting impedance can be found in the region 320 of higher resistance in the control plane, and the fluctuations in the core 234 may reach the outer extreme of the hysteresis loop of FIG. 1B, in which case the losses in the core 234 are very high. Thus, it is seen that the delivered power to the coil antenna 120 will necessarily vary as the plasma-loaded impedance of the coil antenna 120 varies, a significant disadvantage.

Various other impedance match techniques are known in addition to the foregoing. For example, to avoid the problem of load-dependent losses in the saturable reactor cores, the saturable reactors may be discarded in favor of mechanically variable capacitors. However, such mechanically tunable devices are relatively slow and subject to mechanical breakdown. Frequency tuning is a technique in which the RF generator frequency is varied so as to follow the resonant frequency of the plasma-loaded antenna. The main disadvantage of this technique is that, while it does succeed in maintaining the load impedance nearly free of any reactance, it does result in a variation in delivered RF power as the RF generator frequency is changed, due to impedance magnitude mismatch. Another technique is load power serving, in which the amount of delivered power is monitored, and the RF generator power is varied as necessary so as to maintain the delivered power at a nearly constant level. The disadvantage of this technique is that the power and heat dissipation requirements imposed upon the RF power generating system are greatly expanded, representing an increased cost and bulkiness. Another disadvantage is that it requires the measurement of power, which entails a measurement of voltage, current and the phase between them. The delivered-power servoing technique can be combined with some advantage with the frequency servoing technique.

A more fundamental problem inherent in all of the foregoing conventional techniques is that their controlling parameters (e.g., resonant frequency, delivered power and so forth) are not those directly affecting plasma characteristics controlled by the object (either the overhead coil antenna, electrode or wafer pedestal) to which the RF generator is connected. Specifically, it is the time rate of change of current in the coil antenna which primarily controls plasma density, and it is the wafer voltage which primarily controls ion energy at the wafer. Thus, the foregoing conventional techniques suffer from the disadvantage that they only indirectly maintain a uniform or constant process profile.

It is an object of the invention to tune the RF generator output to the plasma-loaded coil antenna input (load) while avoiding the foregoing problems. Specifically, the problems to be avoided are mechanically adjustable reactance elements (subject to mechanical failure), load-dependent efficiency variations, bulky magnetic components such as saturable reactors, variations in delivered power with changes in load impedance, the necessity of measuring three parameters (e.g., forward and reverse voltages and phase and/or current, voltage and phase).

It is another object of the invention to provide the foregoing tuning function with reference to parameters directly controlling the most important plasma characteristics, including plasma ion density at the wafer surface and plasma ion energy at the wafer surface.

SUMMARY OF THE INVENTION

In an RF plasma reactor including a reactor chamber with a process gas inlet, a workpiece support, an RF signal applicator (e.g., a coil antenna for radiating a plasma source signal, an electrode for radiating a plasma source signal or a plasma bias signal or a wafer support coupling a plasma bias signal to the wafer) facing a portion of the interior of the chamber and an RF signal generator having a controllable RF frequency and an RF signal output coupled to an input of the RF signal applicator, the invention tunes the RF signal generator to the plasma-loaded RF signal applicator, by sensing a parameter related to plasma ion density (e.g., if the signal applicator applies plasma source power) or related to ion energy (e.g., if the signal applicator applies plasma bias power) and adjusts the frequency of the RF signal generator within a prescribed frequency range so as to seek and maintain the parameter at an optimum (e.g., maximum or minimum) level. The reactor preferably includes a fixed tuning circuit between the RF signal generator and the RF signal applicator.

The parameter may be the reflected power at the signal generator, the power delivered to the signal applicator, the current flow through the signal applicator, the magnitude of the time rate of change (dI/dt) of the current flow through the signal applicator, the product of the current flow through the signal applicator and the frequency, the reflected voltage at the signal generator, the voltage delivered to the signal applicator, or a Fourier component or another function of the voltage applied to the RF signal applicator or the current through the RF signal applicator. The reflected power or delivered power may be selected as the parameter in the case of either an inductively coupled radiator (such as a coil antenna delivering plasma source power) or a capacitively coupled signal applicator (such as an electrode delivering plasma source power or a wafer pedestal electrode delivering bias power). The current or time rate of change of the current may be selected as the parameter in the case of an inductively coupled signal applicator. The reflected voltage, the delivered voltage or a Fourier component of the voltage may be selected as the parameter in the case of a capacitively coupled signal applicator.

In those cases where the selected frequency-tuning parameter is the power delivered to RF signal applicator, the foregoing tuning of the RF signal generator to the RF signal applicator constitutes impedance matching of the RF signal generator output impedance to the RF signal applicator load impedance.

Once the frequency has been reached at which the parameter's magnitude is at least nearly optimized, further compensation is achieved by sensing the magnitude of a selected parameter (such as RF power delivered to the RF signal applicator) relative to a desired target value and varying the RF signal output level of the signal generator so as to set and maintain the selected parameter at the target value. This feature is particularly advantageous where the foregoing frequency servoing does not provide an ideal match between the output and load impedance magnitudes.

In addition to or in lieu of such power servoing for compensating for a mismatch between output and load impedance magnitudes, a transformer may be provided between the RF signal generator and the RF signal applicator. The transformer has a transformer ratio corresponding to an anticipated output/load impedance magnitude ratio (or average ratio in an anticipated range of ratios). (Such a ratio is the ratio between the load impedance magnitude of the plasma-loaded signal applicator and the output impedance of the RF signal generator.) Alternatively, the transformer has plural selectable transformer ratios between the RF signal generator and the RF signal applicator. In this case, the invention includes a method of selecting one of the ratios best corresponding to an anticipated load/output impedance magnitude ratio.

The transformer may include plural transformer windings corresponding to respective ones of the plural transformer ratios and plural switches connecting respective ones of the transformer windings to the RF signal applicator. The switches may be under automatic control and may be RF switches, mechanical switches or electrical switches. In one embodiment, the plural transformer windings are secondary windings, the transformer apparatus further including a primary winding coupled to the RF signal generator. Preferably, however, the plural transformer windings are in a multi-filar transmission line transformer.

DETAILED DESCRIPTION OF THE PREFERRED EMBODIMENTS

Figure 1A:
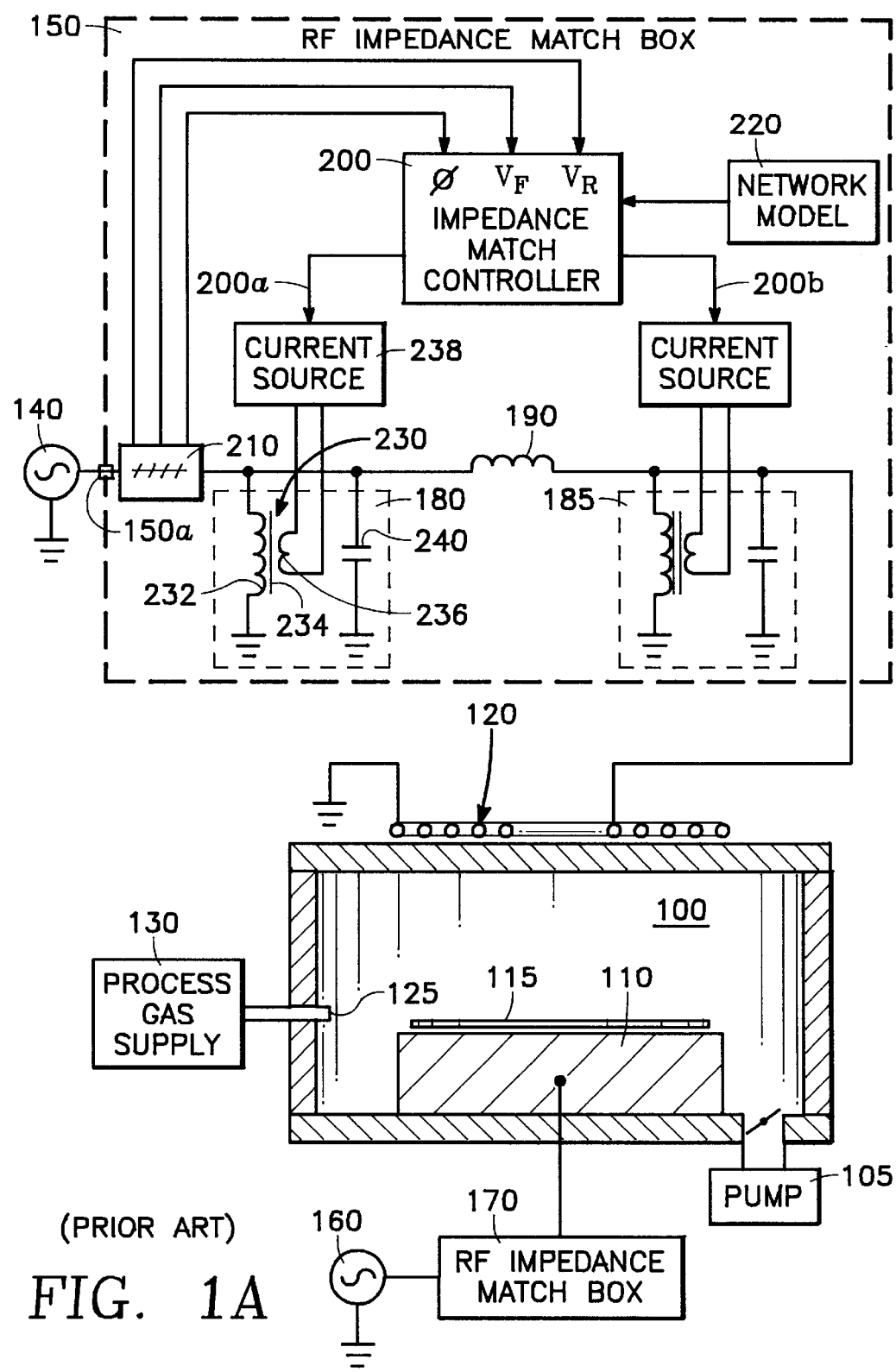
FIG. 1A is a schematic diagram of a plasma reactor including an RF impedance match box of the prior art.
Figure 1B:
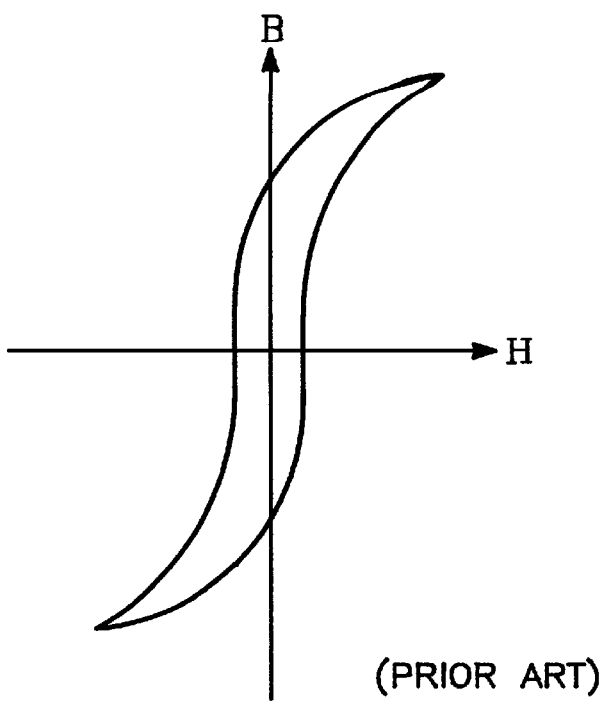
FIG. 1B illustrates the magnetic hysteresis losses in a saturable reactor of the RF impedance match box of FIG. 1A, in which the horizontal axis is the applied magnetic field H and the vertical axis is the induced magnetic field B.
Figure 1C:
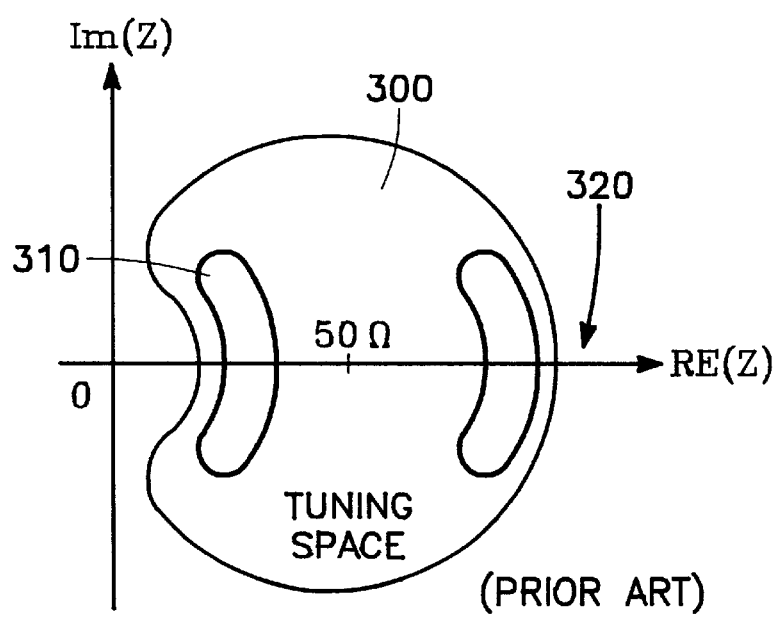
FIG. 1C illustrates a complex plane of the impedance of the RF impedance match circuit in which the real component of impedance is the horizontal axis and the imaginary component is the vertical axis.

Introduction:

The invention tunes the RF generator output to the signal applicator load by servoing the RF frequency so as to optimize a characteristic of the plasma, such as plasma ion density or ion energy at the wafer. The invention accomplishes this by servoing the frequency in accordance with a measured parameter (power, voltage or current) directly related to the plasma characteristic to be optimized. The frequency is servoed within a range until the parameter's magnitude reaches an optimum value (which is either a minima or a maxima within that frequency range, depending upon the parameter). The invention also controls an output magnitude of the RF signal generator (e.g., output power, output current or output voltage) so as to further optimize the same RF parameter or optimize another RF parameter. For an inductively coupled signal applicator (such as a coil antenna), the plasma characteristic to be optimized is typically plasma ion density, and the relevant parameter(s) may be reflected power at the generator output (which is optimum when at a minima), or delivered power or current flow (I) or time rate of change of the current (dI\dt) through the signal applicator or the product of current and frequency (any of which is optimum when at a maxima). For a capacitively coupled signal applicator (such as an electrode), the plasma characteristic to be optimized can be either plasma ion density (if the electrode is radiating plasma source power) or ion energy (if the electrode is radiating bias power, as in the case of a wafer pedestal-electrode). In this case, the relevant parameter(s) can be reflected power, delivered power, reflected voltage or delivered voltage or a Fourier component or other function of the voltage or current. If the parameter selected for frequency control is delivered power, then the foregoing tuning process constitutes impedance matching.

In operation, a frequency servo control loop and a generator output magnitude (power, voltage or current) servo control loop are employed. At first, the frequency control loop overcomes a very large initial impedance mismatch by seeking the RF generator output frequency at which the parameter (such as, for example, the parameter dI\dt, the time rate of change of the current through an inductive plasma source signal applicator) reaches a local maximum value within the specified frequency range. Once this is accomplished, or at least nearly accomplished, the other control loop can begin operating while the frequency control loop continues to operate. Together, the two control loop optimize the desired plasma characteristics despite changing load conditions on the RF signal applicator. Such changing load conditions are typically attributable to subtle changes inside the reactor chamber (e.g., on-going deposition of materials on chamber walls and so forth).

Such frequency tuning can fail to completely optimize the selected parameter. For example, it can leave a mismatch between load and output impedance magnitudes even after reaching the optimum frequency. Therefore the servo control loop governing the signal generator output magnitude (of output power, output current or output voltage)—which may be referred to as a secondary control loop—provides further optimization. Preferably, the secondary control loop adjusts the output power of the RF generator to set and maintain the selected parameter (or another parameter) at a desired set point or magnitude.

The invention frequency tunes so as to regulate the plasma characteristic which is to be controlled. Take for example, one plasma characteristic, namely plasma ion density: Plasma ion density is a function of the following measurable parameters: plasma source power (i.e., an inverse function of reflected power and a function of delivered power) at the plasma source signal generator output; time rate of change (dI/dt) of current flow in the inductive signal applicator, or, equivalently for sinusoidal waveforms, the product of the current flow (I) and the frequency. Since the invention servos the frequency so as to optimize these parameters, it directly controls the desired plasma characteristic (e.g., plasma ion density), a significant advantage.

A similar analysis holds true with respect to another plasma characteristic, namely ion energy at the wafer: Ion energy at the wafer is a function of the following measurable parameters: bias power (an inverse function of reflected power and a function of delivered power at the bias generator output); wafer voltage (which is typically sensed in an AC-coupled measurement across an electrostatic wafer chuck). The wafer voltage itself is a function of the delivered voltage at the bias generator output and an inverse function of the reflected voltage at the bias generator output. Since the invention servos the frequency so as to optimize these latter parameters, it directly controls the desired plasma characteristic (e.g., ion energy), which is a significant advantage.

Figure 2A:
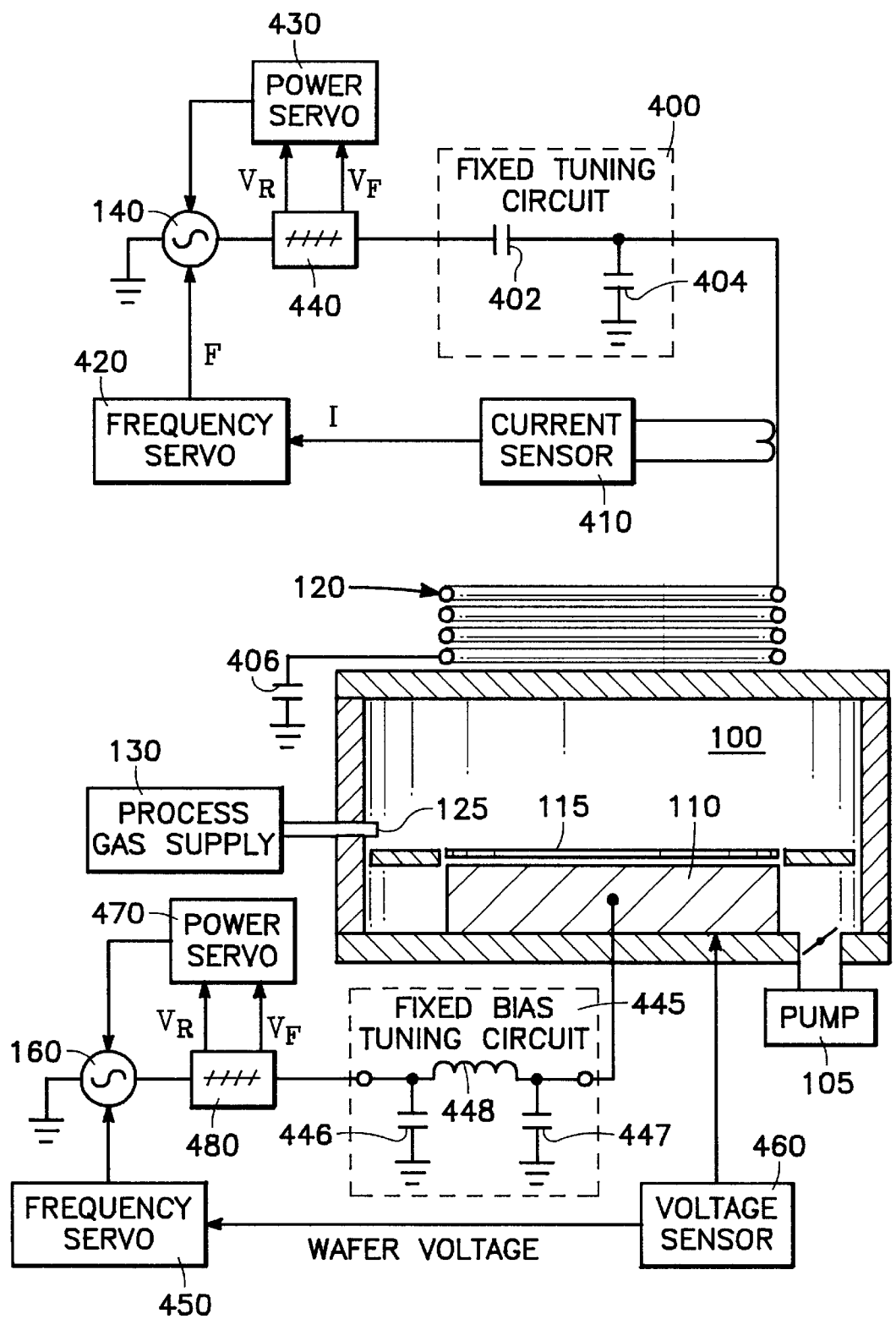
FIG. 2A illustrates a first embodiment of the invention capable of carrying out a tuning process of the invention.

Frequency Servoing of the Plasma Source Power:

Referring to FIG. 2A, the RF plasma source signal applicator 120 in the drawing happens to be an inductive applicator in the form of a coil antenna or solenoid, although this is not particularly germane to the invention, as the invention is not limited to a particular coil antenna, nor to a coil antenna generally and is equally applicable to a reactor employing an electrode as a plasma source signal applicator. The RF plasma source signal generator 140 has a variable or controllable frequency and is connected to the coil antenna 120 through a fixed tuning network 400 consisting of reactive elements such as (optionally) a series capacitor 402, a parallel capacitor 404 and/or a series capacitor 406, although any suitable fixed tuning circuit may be employed. These capacitive elements, together with the inductive coil antenna 120, provide a LC tuning network. A current sensor 410 monitors the RF current to the coil antenna 120. A frequency servo 420 periodically samples the coil antenna current sensed by the current sensor 410 and uses that information to control the frequency of the RF source signal generator 140. The frequency servo 420 may be designed to implement a control method. For example, the frequency servo 420 may comprise an integrated circuit microprocessor programmed to carry out the control method. The skilled worker may choose from among many suitable circuit topologies other than those shown in FIG. 2A for balancing the antenna.

In general, this control method is such that the RF source signal frequency is servoed so as to optimize the one plasma characteristic primarily controlled by the plasma source power, namely plasma ion density. In general the plasma ion density is affected by the current (I) in the coil antenna and more specifically by the magnitude of the time rate of change in the coil antenna current (dI\dt). Thus, the process controls the plasma source signal frequency so as to optimize either the coil antenna current, or more preferably to optimize the magnitude of the change in the coil antenna current (dI\dt) or the product of the current (I) and the RF frequency.

In a first embodiment of this process, the frequency servo 420 changes the frequency of the generator 140 in response to changes in the coil antenna current in such a way as to maximize the coil antenna current with respect to frequency within a range from a low frequency to a high frequency and then maintain this optimum condition thereafter despite subtle slow variations in the load impedance. Such variations are caused by relatively gradual changes in the plasma process conditions (arising from, for example, the deposition or removal of polymer and/or other material on the chamber walls).

In a second embodiment of this process, the frequency servo 420 changes the frequency of the generator 140 in response to changes in the coil antenna current in such a way as to optimize the time rate of change (dI\dt) in coil antenna current with respect to frequency within a frequency range from a low frequency to a high frequency. In one version of this embodiment, the frequency servo 420 changes the frequency so as to maximize the product of the coil antenna current (I) multiplied by the RF frequency (f) with respect to frequency within a frequency range from a low frequency to a high frequency. Since the coil current generally has a sinusoidal form, the product If is at least a good approximation of dI/dt.

In a third embodiment of this process, the frequency servo 420 changes the frequency of the generator 140 in response to changes in the delivered or reflected power (as measured at the signal output of the generator 140) in such a way as to maximize the delivered power or minimize the reflected power, within a frequency range from a low frequency to a high frequency.

Figure 2B:
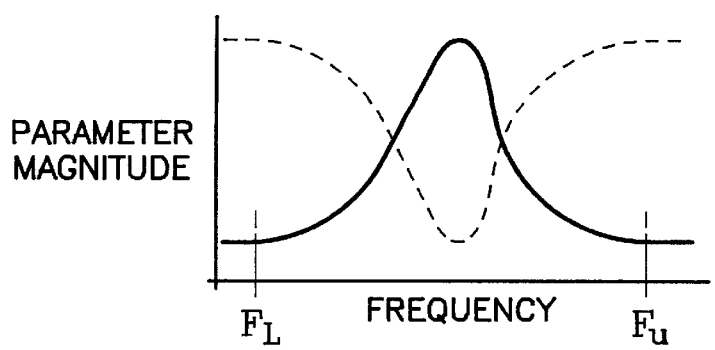
FIG. 2B is a graph of the magnitude of a selected measurable parameter (such as delivered power) versus RF generator frequency.
Figure 2C:
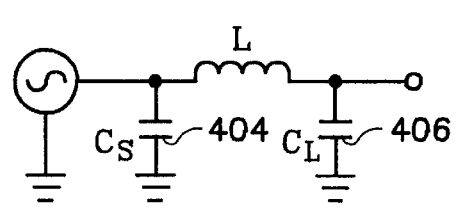
FIG. 2C illustrates a resonant circuit formed by the coil antenna of the reactor and lumped tuning elements.

FIG. 2C illustrates a general tuning circuit which includes the inductance L of the coil antenna 120, the capacitance $C_S$ of the parallel capacitor 404 and the capacitance $C_L$ of the series capacitor 406 at the grounded end of the coil antenna 120. The capacitances $C_S$ and $C_L$ are chosen so that the voltage on the winding nearest the chamber ceiling is lowest. Many different circuit arrangements besides the ones disclosed above may be employed in carrying out the invention.

Power Servoing of the Plasma Source Power:

As discussed previously herein, frequency servoing can leave a mismatch between the magnitudes of the load and output impedances, leading to some reflected power. In order to compensate for such reflected power losses, a power servo 430 shown in FIG. 2A controlling the signal output level of the generator 140 monitors the forward and reflected RF voltages ($V_F$ and $V_R$, respectively) sensed at the output of the source signal generator 140 via a directional coupler 440, to determine delivered power. The power servo 430 changes the output power of the generator 140 so as to maintain one of the measured parameter mentioned hereinabove (such as, for example, the delivered RF power, current, time rate of change of current or the product of current×frequency) at or near a desired set point. The power servo 430 may comprise an integrated circuit microprocessor programmed to carry out this function.

FIG. 2B is a graph of the magnitude of a selected parameter versus frequency, depicting in solid line the behavior of a selected parameter (such as delivered power or inductive coil current rate of change) which is to be maximized. Note that within a limited frequency range the parameter exhibits a local maximum, which the frequency servo 420 seeks. This graph also depicts in dashed line the behavior of another parameter (such as reflected power) which is to be minimized. Within the limited frequency range, this other parameter exhibits a local minimum, which the frequency servo 420 seeks.

In order to minimize unnecessary power adjustments by the power servo 430, the power servo 430 could be disabled until the frequency servo 420 has servoed the selected parameter to within a predetermined threshold maximum level (or minimum level, depending upon the parameter type). This ensures that when a very large out-of-tune condition or mismatch exists (for example, when the system is first turned on), the frequency servo 420 operates by itself to seek an approximate initial tune condition or match before the power servo 430 increases the RF power to compensate for any residual impedance magnitude mismatch. This reduces the initial amount that the power servo 430 increases the RF power. This feature is readily implemented by the skilled worker in a variety of ways. For example, the system may be programmed to not enable the power servo 430 until the frequency servo 420 had achieved a predetermined percentage improvement (e.g., an increase) in the magnitude of the selected parameter from an initial magnitude.

Frequency Servoing of the Bias Power:

Referring again to FIG. 2A, the bias signal generator 160 is connected to a bias signal applicator, which is typically the wafer pedestal 110, through a fixed bias tuning circuit 445 consisting of reactive elements such as capacitors and/or inductors. A D.C. blocking capacitor (indicated in dashed line) may be connected between the pedestal 160 and the circuit 445. Ideally, the frequency of the RF bias signal generator 160 driving the wafer pedestal 110 is servoed in such a manner as to optimize the one plasma parameter primarily controlled by the bias power applied to the pedestal 110, namely the wafer voltage. However, since the presence of an electrostatic chuck may prevent direct (DC-coupled) measurement of the wafer voltage, some component of the AC-coupled measurement of the wafer voltage can be measured to provide an indication of the true wafer voltage. For example, the parameter can be a Fourier component (e.g., the first or second harmonic) of the voltage measured at the wafer pedestal. In this case, the bias power frequency is servoed so as to maximize a quantity related to the D.C. bias voltage (which in some cases may not be directly measurable), such as a selected component of the pedestal voltage (measured via A.C. coupling) with respect to frequency over a range of frequency from a low frequency to a high frequency. This component may, for example, be a harmonic (e.g., second harmonic) of the voltage. As referred to above, the bias voltage of the pedestal may be measurable only through A.C. coupling, so that the bias voltage is not directly measurable. However, the D.C. bias voltage of the pedestal (or semiconductor workpiece or wafer) may be estimated using techniques well-known in the art. As will be discussed below with respect to FIGS. 3 and 4, the pedestal voltage waveform is similar to a half-wave rectified wave form, and it is well-known that the D.C. bias level of a half-wave rectified sinusoidal waveform may be computed from certain Fourier components of a half-wave rectified sinusoidal waveform. In the present case, to the extent the pedestal or wafer voltage is similar to a half-wave rectified waveform, its D.C. bias may be estimated from its Fourier components.

In an alternative embodiment, the frequency of the RF bias signal generator 160 driving the wafer pedestal 110 is servoed in such a manner as to maximize delivered power or minimize reflected power (as measured at the signal output of the bias signal generator 160) within a range of frequencies from a low frequency to a higher frequency.

In carrying out the preferred process, a bias power frequency servo 450 controlling the output frequency of the RF bias signal generator 160 responds to the output of a voltage sensor 460 connected to the wafer pedestal 110. The bias power frequency servo 450 performs a process in which the wafer voltage is decomposed into a particular component and the bias frequency is servoed to maximize that component. The bias frequency servo 450 may comprise an integrated circuit microprocessor programmed to carry out that process.

Figure 2D:
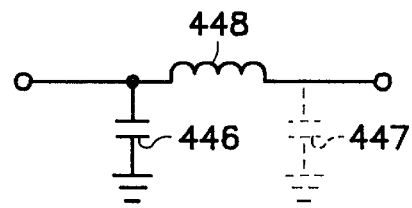
FIGS. 2D, 2E and 2F illustrate various tuning circuits for driving the wafer pedestal in the reactor of FIG. 2A.
Figure 2E:
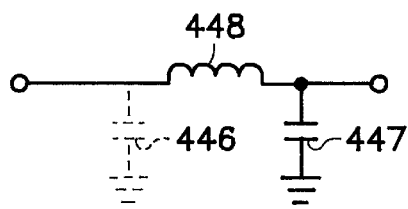
Figure 2F:
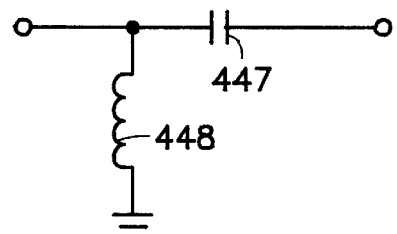

The fixed bias tuning circuit 445 in general can be an L-network, or it may be a pi-network (as shown in the drawing) consisting of a pair of parallel capacitors 446, 447 connected across each side of a series inductor 448. FIG. 2D shows how the capacitor 447 can be eliminated if the magnitude of the input impedance presented by the plasma-loaded coil antenna 120 is less than the magnitude of the output impedance of the RF bias generator 160. FIG. 2E illustrates how the capacitor 446 can be eliminated if the magnitude of the load impedance is greater than that of the generator 160. FIG. 2F illustrates how the circuit of FIG. 2E may be reversed to achieve the same result. The pi-network 445 of FIG. 2A is preferred if the plasma-loaded antenna input impedance can vary above or below the generator output impedance. In general, any suitable tuning circuit topology may be employed in carrying out the invention.

Figure 3:
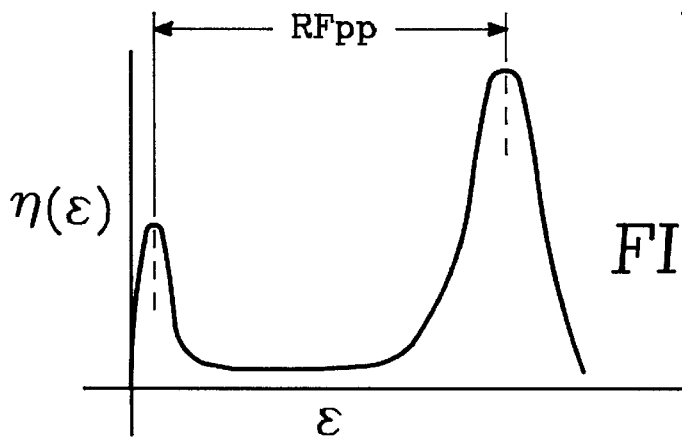
FIG. 3 is a graph illustrating the plasma ion energy distribution, in which the horizontal axis is ion energy and the vertical axis is number of ions.
Figure 4:
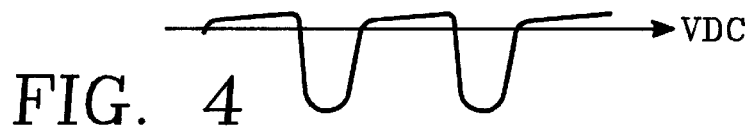
FIG. 4 is a diagram illustrating the waveform of the wafer voltage in the reactor of FIG. 2A.

FIG. 3 illustrates the distribution of plasma ion energy, in which the vertical axis is number of ions while the horizontal axis is ion energy. There are two peaks, one at a low ion energy and one at a higher ion energy. The shape of the distribution illustrated in FIG. 3 tends to change with various conditions including RF bias power frequency. FIG. 3 is typical for a high density plasma at low electron temperature (for a thin plasma sheath) at an RF bias frequency sufficiently low so that most of the plasma ion traverse the sheath in a single RF cycle and where the cathode and anode have different effective areas. FIG. 4 illustrates the behavior of the voltage of the plasma-immersed wafer, the voltage having a waveform somewhat similar to a half-wave rectified sinusoidal voltage. It is the higher voltage peak which predominantly governs the plasma ion energy near the wafer surface. In other words, the plasma ion energy distribution of FIG. 3 is affected by the wafer voltage of FIG. 4 and in particular by the higher peak voltage thereof. By controlling the bias power frequency to control the peak of the wafer voltage waveform of FIG. 4 (or a component thereof), the ion energy distribution of FIG. 3 is controlled, thus controlling the plasma ion energy. For certain applications, such as those employing a higher RF bias frequency, it may be better to control the D.C. bias voltage rather than the peak voltage.

Power Servoing of the Bias Power:

As discussed with reference to the source power frequency servo 420, frequency servoing does not compensate for a mismatch in impedance magnitude, and this is true in the case of frequency servoing of the bias signal generator 160. In order to provide such compensation in the case of the bias signal generator 160, a bias power servo 470 receives forward and reflected voltages at the generator output from a directional coupler 480 connected in series with the generator output. The power servo 470 changes the output power of the bias generator 160 so as to set and maintain a selected parameter (such as the wafer voltage or the delivered bias power) at a desired set point. It should be noted that the servo 470 may not necessarily servo the generator power but may instead servo a generator output parameter other than power, such as output current or output voltage, and thus may be a generator current servo or a generator voltage servo rather than a power servo.

Figure 5:
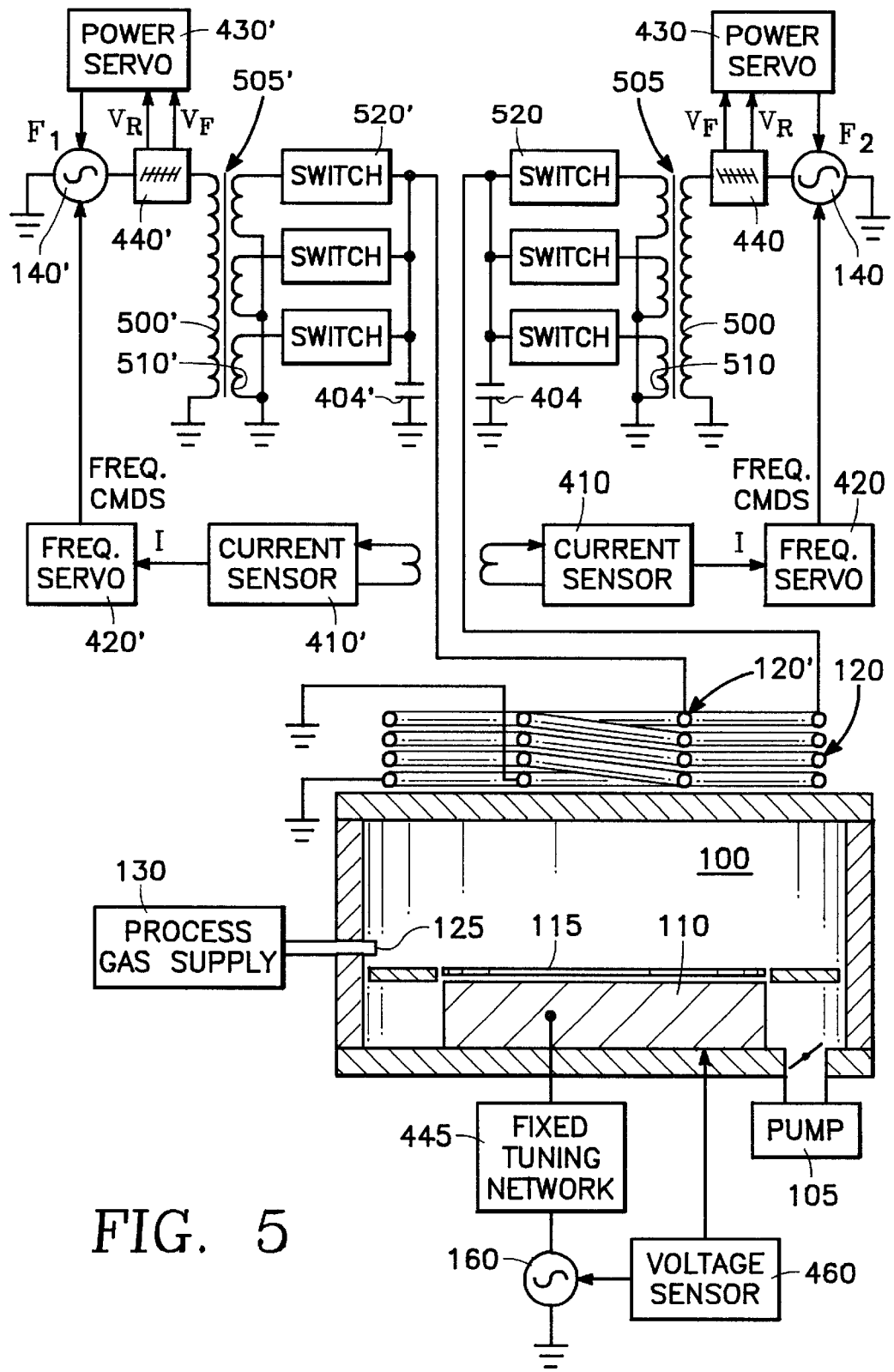
FIG. 5 illustrates a second embodiment of the invention employing a transformer with multiple switched windings.

Power Servoing with Switches and Multiple Transformers:

In order to facilitate the impedance magnitude mismatch compensation performed by the plasma source power servo 430, an RF transformer may be connected in series between the source signal generator 140 and the coil antenna 120 having a transformer ratio suitable for compensating for the resistance mismatch. For example, the transformer ratio can correspond to the middle of the anticipated range of resistance mismatch between the generator 140 and the load impedance presented by the tuning network 400 and the plasma-loaded coil antenna 120 for a particular plasma process. FIG. 5 illustrates this concept. In FIG. 5, the source signal generator 140 is connected to a primary transformer winding 500 of a transformer 505 while the coil antenna 120 is connectable to any one of several secondary windings 510 providing different transformer ratios through respective RF switches 520. Each secondary winding provides a ratio suitable for a particular plasma process for which the reactor may be used. Depending upon the process to be performed next, the appropriate one of the RF switches 520 is closed while the others remain open. Alternatively, some combination of the switches 520 can be closed to provide $2^n$ choices of resistance matching ranges, where n is the number of secondary windings and RF switches therefor. Each of RF switches 520 may be a PIN diode, a saturable reactor or a mechanical switch or relay, as but several examples of expedients well-known in the art.

The various inductive and capacitive elements (e.g., the capacitors 404, 406 or the individual capacitive and/or inductive elements of the tuning circuit 445) may be fixed or they may be individually switched or variable (e.g., motorized). Even if these elements are variable, they are set to particular values to which they remain fixed for the duration of a given process step, so that the tuning they provide is a fixed tuning. Thus, for example, the tuning circuit 445 is a fixed tuning circuit for a given process step. Generally, the various inductive and capacitive elements are selected for approximate resonance within a certain frequency range for an approximate or near RF tune condition (or impedance match) at various points within the frequency range. Then, as plasma load conditions vary, the frequency servo loop (e.g., 450) and the magnitude (i.e, power, voltage or current) servo loop (e.g., 470) maintain the near RF tune condition. Likewise, the switches 520 may be set during the entire plasma processing to an optimum setting for a certain set of plasma processing conditions, the system then relying on the frequency and magnitude servo loops (450 and 470) to compensate for changes plasma load conditions.

FIG. 5 illustrates how the same type of multiple ratio transformer with multiple RF switches is employed in the same manner to provide multiple selectable transformer ratios between the bias RF signal generator and the wafer pedestal.

Figure 6:
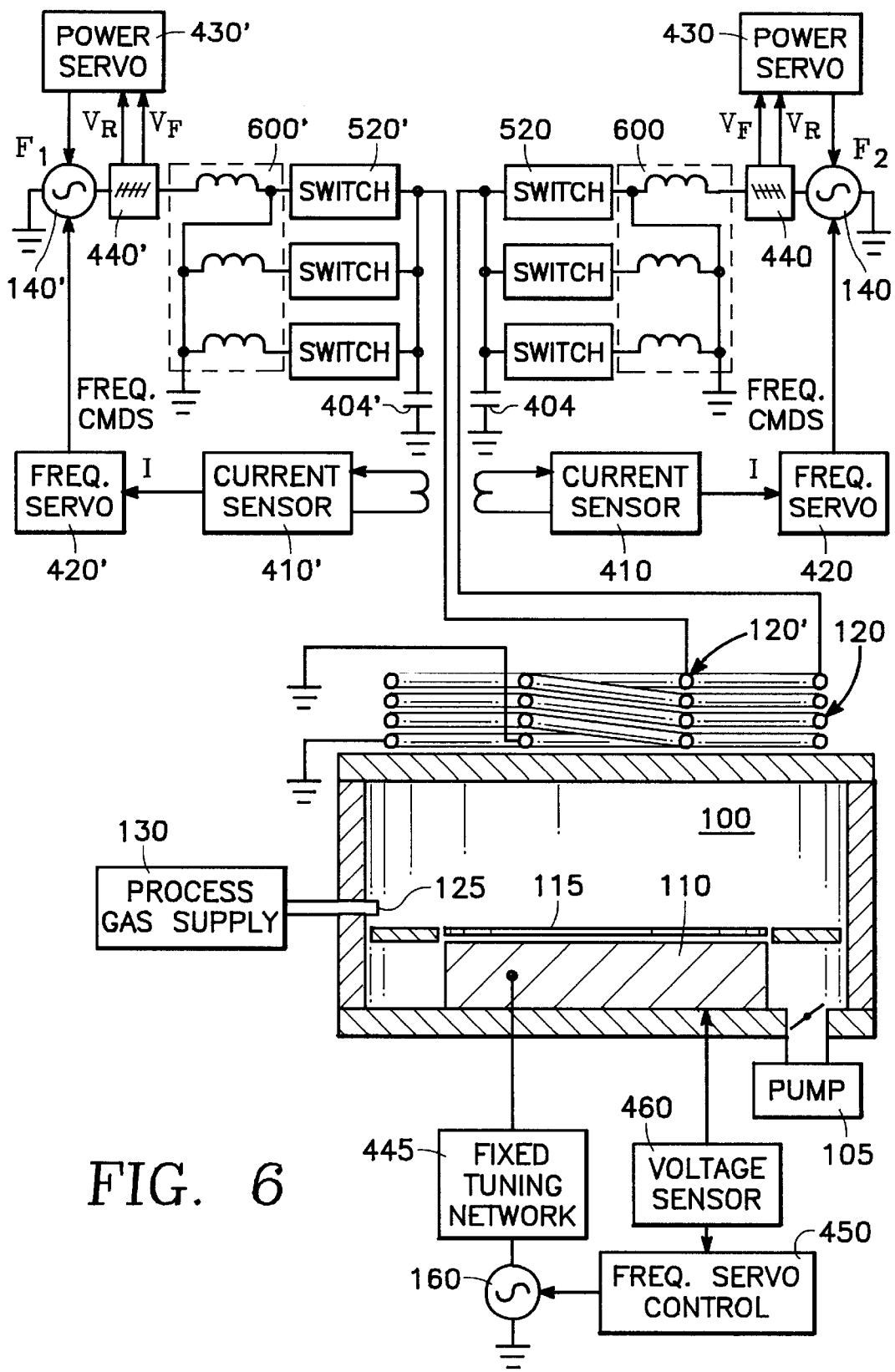
FIG. 6 illustrates a third embodiment of the invention employing a multi-filar transformer with multiple switched outputs.

FIG. 6 illustrates the preferred implementation of this concept, in which the different transformer ratios are provided by different windings of the same multi-filar transmission line transformer ("balun"). Thus, each transformer 505, 505' is replaced by a conventional multi-filar transmission line transformer 600, 600' with plural windings. Optionally, series capacitors may be added. FIG. 6 illustrates schematically the conventional topology of the multi-filar transmission line transformers 600, 600', which is well-known in the art and need not be discussed further in this specification.

FIG. 6 also illustrates how an identical multi-filar transmission line transformer 600" with multiple RF switches 520" is employed in the same manner to provide selectable transformer ratios between the bias signal generator 160 and the wafer pedestal 110. While FIG. 6 illustrates an embodiment in which the switches and transformer 520", 600" are connected to the output side of the fixed tuning circuit 445, the switches and transformer 520", 600" may instead be connected to the input side of the fixed tuning circuit (i.e., between the fixed tuning circuit 445 and the generator 160). Furthermore, the switches and transformer 520", 600" may constitute inductive elements of the fixed tuning circuit 445.

Preferably, the tuning capacitor 404 is placed on the output side of the transformer 600 so that the resonance point does not shift with the switching of the switches 520.

As illustrated in FIG. 5, a second coil antenna 120' concentric with and surrounded by the coil antenna 120 may be provided and connected to its own independent source power supply 140' through its own match circuit/transformer 500', 505', 510', 404', 406', 410', 420', 430', 440'. The ranges of the frequencies F1, F2 of the source signal generators 140, 140' are preferably mutually exclusive and are exclusive of the frequency range of the bias signal generator 160. Thus, in a preferred embodiment, the invention employs three mutually exclusive frequency ranges, one for each of the generators 140, 140' and 160. In one embodiment, the range of the bias signal generator 160 is from 1.5 to 1.9 MHz, the range of the source signal generator 140 is from 1.9 to 2.1 MHz and the range of the source signal generator 140' is from 2.2 to 2.4 MHz.

Figure 7:
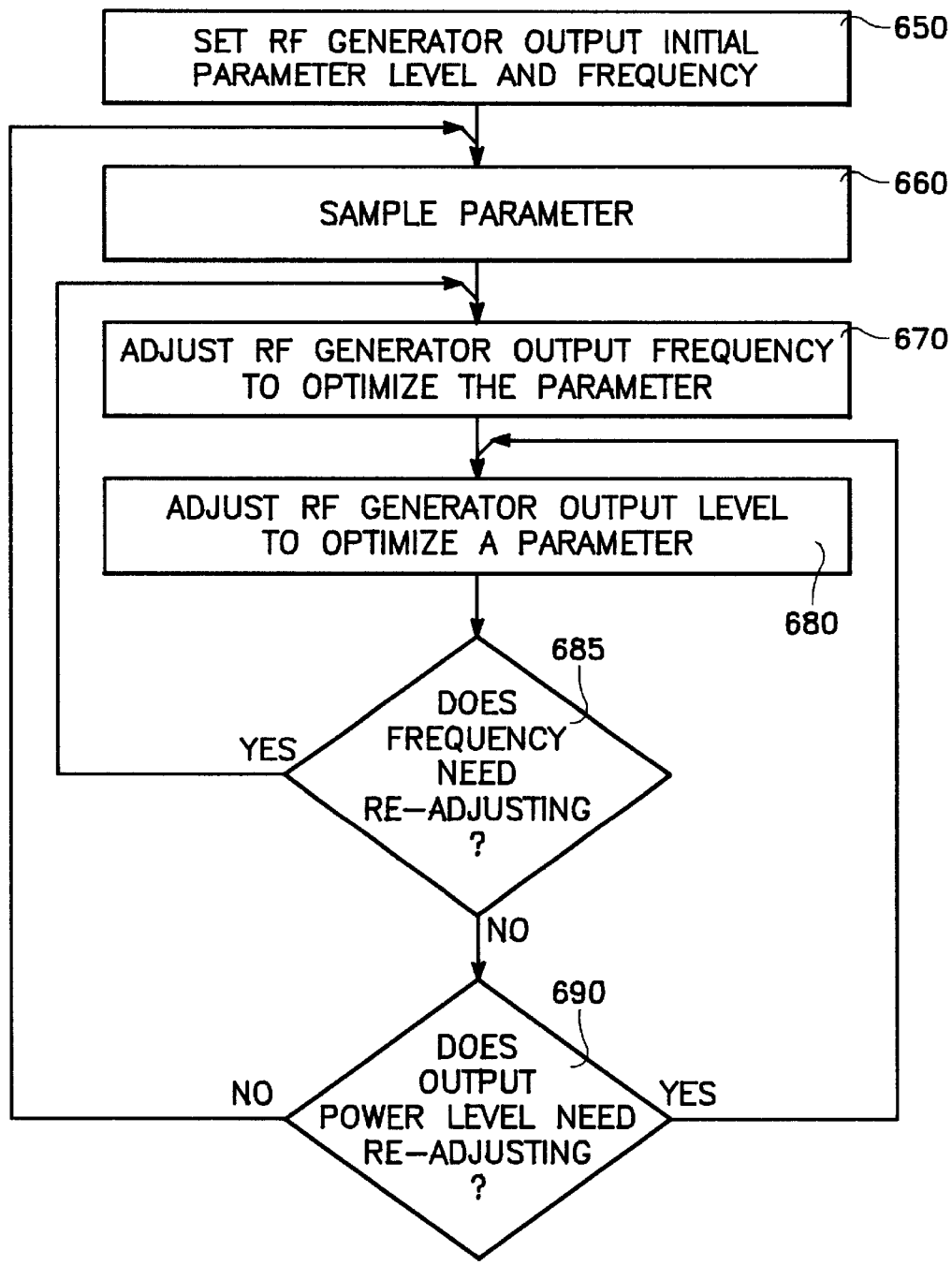
FIG. 7 is a block flow diagram illustrating the operational concept of a basic mode of the invention.

Frequency Servoing Control Algorithms:

FIG. 7 is a flow diagram illustrating a basic concept of the operation of the invention. This first step in the operation (block 650 of FIG. 7) is to set the RF generator output to an initial power level and frequency. The next step (block 660) is to sample the magnitude of the selected parameter. As discussed hereinabove, this parameter may be one measured at the generator output such as the reflected power, the delivered power, the reflected or forward voltage or the phase angle therebetween, the reflected current, the forward current or the phase angle therebetween or the voltage and current and the phase therebetween or a Fourier component of the voltage or current. Or, this parameter may be one measured elsewhere, such as the current flowing in the inductive coil antenna or its time rate of change or its product with RF frequency, or the wafer pedestal voltage or some Fourier component of the pedestal voltage. The next step (block 670) is to adjust the frequency so as to optimize one of these parameters. As but a few examples, the phase difference between two related parameters (e.g., the current and voltage) may be minimized, or the reflected power may be minimized, or the delivered power or voltage may be maximized, and so forth. Having at least nearly met the desired goal of the second step, the final step (block 680) is to adjust the generator signal output level to maintain the magnitude of the same parameter or another one of the above-listed parameters at a desired set point. Thereafter, if there is an impedance (e.g., phase) mismatch (block 685) the step of block 670 is repeated, and if the selected parameter's magnitude wanders from the desired set point (block 690), the step of block 680 is repeated.

Figure 8:
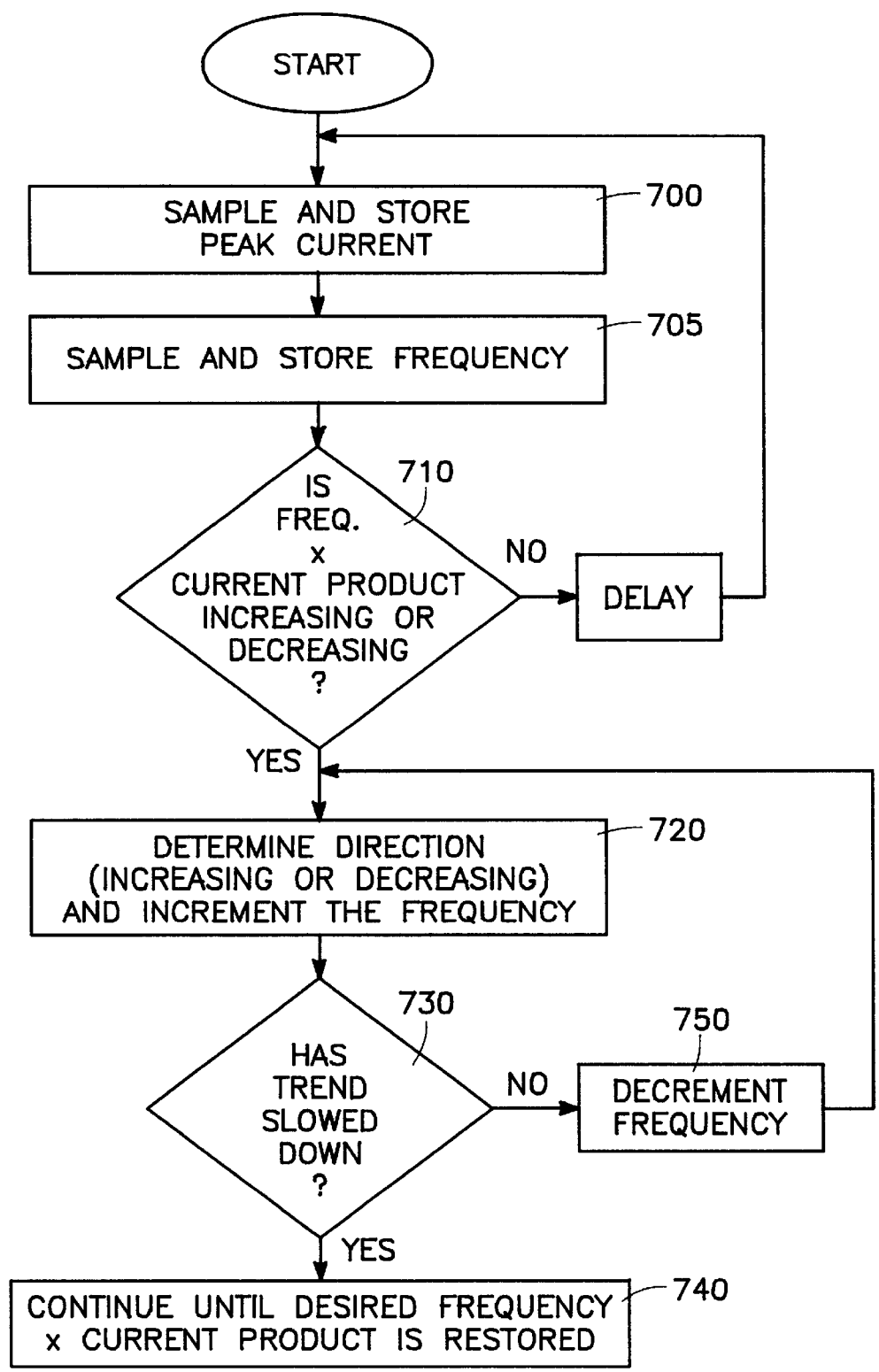
FIG. 8 is a block flow diagram illustrating one embodiment of a process carried out by the source signal frequency servo.
Figure 9:
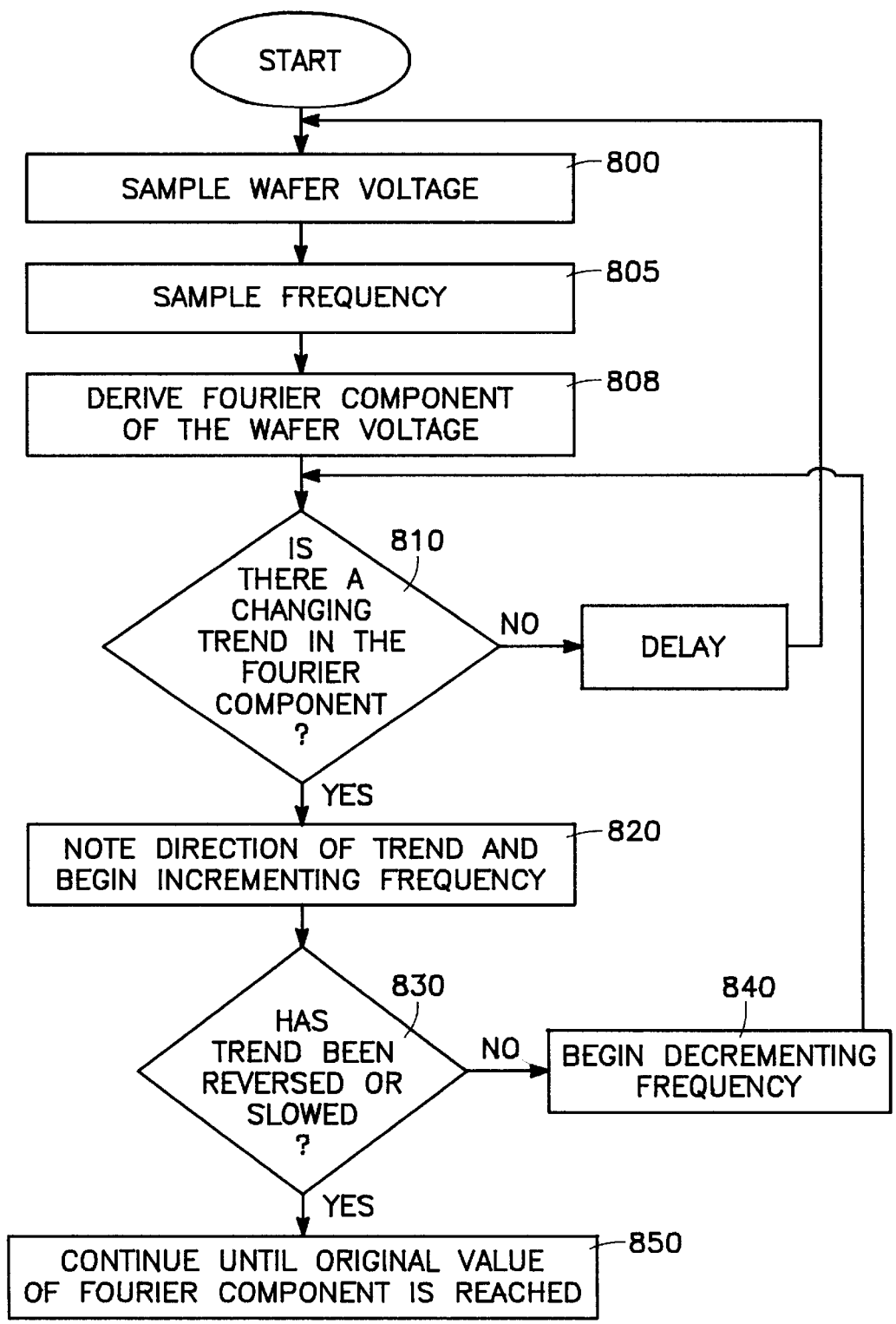
FIG. 9 is a block flow diagram illustrating one embodiment of a process carried out by the bias signal frequency servo.

FIGS. 8 and 9 are flow diagrams illustrating the processes carried out by the source power frequency servo 420 and the bias power frequency servo 450, respectively. Referring to FIG. 8, the source power frequency servo periodically samples and stores a certain parameter which, in the following example, is the peak magnitude of the RF current sensed by the current sensor (block 700). (The selected parameter may be any one of the parameters listed previously herein.) It simultaneously stores the corresponding (current) value of the RF frequency of the generator and computes a current-frequency product, which it stores (block 705). The servo then determines from the last n current-frequency products whether there is an upward or downward trend in the current-frequency product exceeding a predetermined threshold of difference over n sample times (block 710). If such a trend is detected (YES branch of block 710), then the servo notes the direction of the trend (increasing or decreasing products over time) and begins incrementing the RF frequency in uniform steps (block 720). The servo then determines whether the trend of increasing or decreasing frequency products has been slowed down (or even reversed) after a predetermined number m of sample times (block 730). If so (YES branch of block 730), the servo continues incrementing the RF frequency until the frequency-current product is restored to within a predetermined tolerance of its desired value (block 740). Returning to block 730, if incrementing the RF frequency does not slow down the detected trend (No branch of block 730), the servo begins decrementing the RF frequency until the frequency-current product is restored to within a predetermined tolerance of its desired value (block 750).

Referring to FIG. 9, the bias power frequency servo periodically samples and stores a certain parameter which, in the following example, is the magnitude of the wafer voltage sensed by the voltage sensor (block 800), and then bases its control upon a related parameter, which in the following example is a selected Fourier component of the wafer voltage. (As in the example of FIG. 8, the selected parameter of FIG. 9 may be any one of the parameters listed previously herein and the control may be based either upon the parameter itself or upon a selected function of that parameter, such as a Fourier component.) The frequency servo simultaneously senses the corresponding (present) value of the RF frequency of the bias generator, which it stores (block 805). The servo then derives, for the current sample time, a Fourier component of the wafer voltage based upon k previously stored samples thereof (block 808). The servo then determines from the Fourier components of the last n sample times whether there is an upward or downward trend in the Fourier component exceeding a predetermined threshold difference over the n sample times (block 810). If such a trend is detected (YES branch of block 810), then the servo notes the direction of the trend (increasing or decreasing samples of the Fourier component over time) and begins incrementing the RF frequency in uniform steps (block 820). The servo then determines whether the trend of increasing or decreasing samples has been slowed down (or even reversed) after a predetermined number m of sample times (block 830). If so (YES branch of block 830), the servo continues incrementing the RF frequency until the Fourier component is restored to within a predetermined tolerance of its desired value (block 840). Returning to block 830, if incrementing the RF frequency does not slow down the detected trend (NO branch of block 830), the servo begins decrementing the RF frequency until the Fourier component is restored to within a predetermined tolerance of its desired value (block 850).

While the methods or algorithms of FIGS. 8 and 9 used the polarity of the change in magnitude between successive samples of the parameter to deduce the needed direction of change in frequency, in some applications an alternative is to infer the direction of the needed change in frequency from the sign of a phase angle, such as the sign of the phase angle between the voltage and current at the generator output.

Preferably, the values of the fixed elements such as reactances in the tuning circuit 400 and the ratio of the transformer 600 are selected to provide an ideal match at the typical operating conditions of the process to be performed. Typically, the plasma-loaded impedance on the coil antenna, for example, is quite predictable for a given process, so that the fixed values are readily selected to provide a close impedance match. The plasma is preferably ignited using the bias RF power on the wafer pedestal to produce a weak capacitively coupled plasma. After plasma ignition, source power is applied to the coil antenna, thereby causing the plasma ion density to increase toward a level at which the plasma-loaded impedance at the antenna begins to approximate the normal operating conditions for which the match circuits were designed. After normal plasma ion density has been achieved, the difference between the plasma-loaded antenna impedance and the match conditions of the fixed components will be relatively small, and are readily compensated by the operation of the frequency servo.

Figure 10:
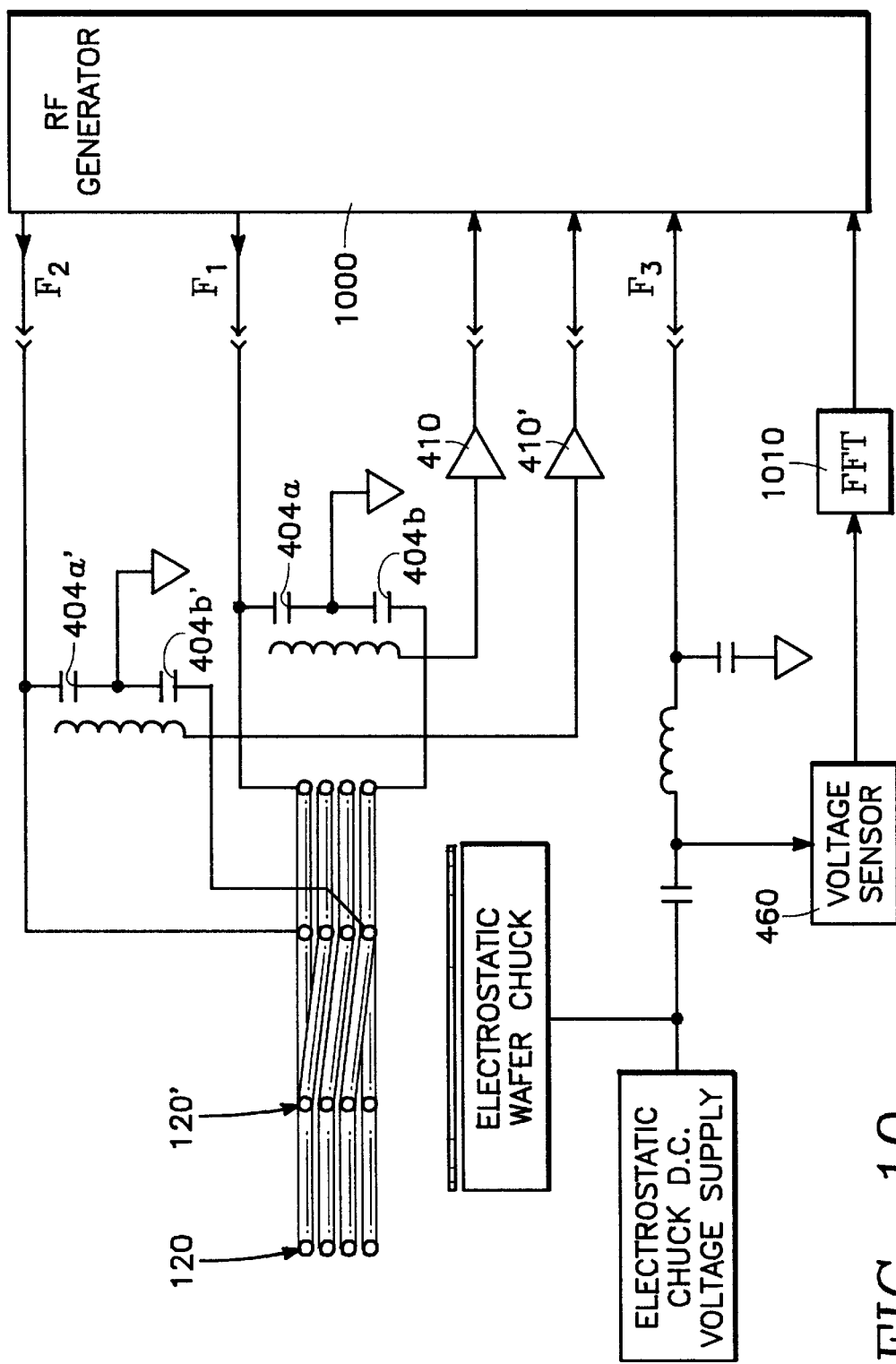
FIG. 10 is a simplified schematic diagram of a preferred embodiment of the invention.

Referring now to FIG. 10, the RF signal generators 140, 140' and 160 of respective output frequencies F1, F2 and F3 connected to the outer and inner solenoids and the wafer pedestal respectively may be provided in a single RF generator system 1000 of the type commercially available. The plasma source power frequency servos 420, 420', the bias power frequency servo 450, the plasma source power servos 430, 430' and the bias power servo 470 are programmed as software modules within the RF generator system 1000. The inner and outer coils 120', 120 are coupled to the generator outputs through capacitive pi-networks formed by the capacitor pairs 404a, 404b and 404a', 404b', respectively. The voltage sensor output from the wafer pedestal voltage sensor 460 is processed in a fast Fourier transform circuit 1010 to provide a selected Fourier component of the pedestal voltage, as described above. Many different parameters may be selected in carrying out the invention in the embodiment of FIG. 10. This is because the commercially available generator system includes, for each RF output, a directional coupler or sensor which can measure at least one of the following sets of parameters measured at the generator outputs: forward and reverse power, load voltage, load current and the phase angle therebetween, forward and reverse voltage and the phase angle therebetween.

The invention adjusts the source or bias RF signal generator frequency to optimize a selected RF generator parameter measured at the generator output or at the RF power applicator. The invention also adjusts an RF generator parameter other than frequency, which may be the selected RF generator parameter or another RF generator parameter, to optimize the same or another RF generator parameter. The term "RF generator parameter" includes delivered voltage, delivered current, delivered power, reflected power, time rate of change of current, the product of current×frequency, a Fourier component of the voltage or current, the phase angle between the voltage and current, or the phase angle between any other two parameters, any of which may be measured at the RF signal generator output or at the RF signal applicator (the coil antenna, wafer pedestal or an electrode) or anywhere along the transmission line between them. It may do all of this simultaneously at two or more signal applicators, such as the bias RF signal applicator (e.g., the wafer pedestal) and the source RF signal applicator (e.g., the coil antenna).

In some cases, the frequency servo may be eliminated, or its role at least reduced. For example, if the plasma-loaded impedance of the signal applicator changes very little over the anticipated range of required plasma processing conditions, then the range of frequencies over which the frequency servo loop operates may be reduced. In fact, it may be reduced to zero, provided the plasma processing conditions vary so little that the combination of the fixed tuning circuit and the signal applicator are never taken out of resonance or near-resonance. For this purpose, the skilled worker may select a fixed tuning circuit which, in combination with the plasma-loaded signal applicator, has a relatively broad resonance band centered at a selected frequency. As described above in this specification, the fixed tuning circuit may consist of either lumped inductive and/or capacitive elements (in the manner of a circuit or discrete elements) or distributed inductive and/or capacitive elements (in the manner of a transmission line). The inductive and/or capacitive values of the fixed tuning circuit are selected so that the combination of the fixed tuning circuit and the plasma-loaded signal applicator operate at or near resonance at a selected RF frequency. In the ideal case in which the frequency servo can be eliminated, this resonance or near-resonance obtains over the entire range of plasma processing conditions. Whether operation is sufficiently near resonance can be evaluated with respect to a number of conditions: (a) whether the VSWR limits of the signal generator at the power level of interest are exceeded, or (b) whether the voltage or current limitations on the signal applicator are exceeded. The latter condition can arise due to a high voltage being induced in the signal applicator which could cause conductor-to-conductor arcing or cause excessive sputtering damage by capacitive coupling to the plasma. The latter condition can also arise due to a high current being induced in the signal applicator which could cause $I^2R$ losses.

While the invention has been described in detail by specific reference to preferred embodiments, it is understood that variations and modifications thereof may be made without departing from the true spirit and scope of the invention.

What is claimed is:

1. In an RF plasma reactor comprising a reactor chamber with a process gas inlet, a workpiece support, an RF signal applicator facing a portion of the interior of said chamber, an RF signal generator having a controllable RF frequency and a controllable output power, and an RF signal output coupled to an input of said RF signal applicator, a tuning method comprising:

selecting a desired plasma ion density value;
   measuring, near one of or between (a) the output of said generator and (b) at said signal applicator, a parameter governing a plasma ion density in said reactor, wherein said parameter consists of one of:
   (a) a Fourier component of the magnitude of the RF current flow to said RF signal applicator
   (b) the magnitude of the time rate of change in RF current flow in said RF signal applicator;
   adjusting said frequency of said RF signal generator so as to at least nearly optimize said parameter near an optimum value corresponding to said desired plasma ion density value; and
   adjusting said output power of said RF signal generator so as to maintain said parameter near said optimum value.

2. The method of claim 1 further comprising providing a tuning circuit between said RF signal generator and said RF signal applicator.

3. The method of claim 1 wherein said RF signal applicator comprises a capacitive electrode adjacent said reactor chamber and said RF signal generator furnishes RF plasma source signal.

4. The method of claim 1 wherein said reactor further comprises a bias RF signal generator having a controllable RF bias frequency and a bias signal output coupled to said workpiece support, said method further comprising:

measuring near said workpiece support a bias signal parameter related to a voltage of said workpiece;
   adjusting said frequency of said bias RF signal generator within a second frequency range so as to at least nearly optimize said bias signal parameter to one of a maximum or minimum value.

5. The method of claim 4 further comprising providing a fixed tuning circuit between said bias RF signal generator and said wafer support.

6. The method of claim 4 wherein said bias signal parameter comprises a Fourier component of the voltage of said workpiece.

7. The method of claim 4 wherein said bias RF signal generator has a bias RF signal output level which is adjustable, said method further comprising:

varying said bias RF signal output level so as to set and maintain said bias signal parameter at least nearly at a desired set point.

8. The method of claim 4 further comprising providing a bias transformer between said bias RF signal generator and said wafer support.

9. The method of claim 8 wherein said bias transformer has a bias transformer ratio corresponding to an anticipated ratio between magnitudes of said bias load impedance at said wafer support and said output impedance of said bias RF signal generator.

10. The method of claim 4 further comprising:

providing bias transformer apparatus having plural selectable bias transformer ratios between said bias RF signal generator and said wafer support; and
    selecting one of said bias ratios best corresponding to an anticipated ratio between magnitudes of said bias load impedance at said wafer support and said output impedance of said bias RF signal generator.

11. The method of claim 1 further comprising:

providing transformer apparatus having plural selectable transformer ratios between said RF signal generator and said RF signal applicator; and
    selecting one of said ratios best corresponding to an anticipated ratio between magnitudes of said load impedance at said input of said RF signal applicator and said output impedance of said RF signal generator.

12. The method of claim 1 further comprising providing a transformer between said RF signal generator and said RF signal applicator.

13. The method of claim 12 wherein said transformer has a transformer ratio corresponding to an anticipated ratio between magnitudes of said load impedance at said input of said RF signal applicator and said output impedance of said RF signal generator.

14. The method of claim 1 wherein said RF signal applicator comprises an inductive coil antenna adjacent said reactor chamber and said RF signal generator furnishes RF plasma source signal.

15. An RF plasma reactor comprising:

a reactor chamber with a process gas inlet, said reactor chamber for containing a workpiece to be processed;
    an RF signal applicator facing a portion of the interior of said chamber;
    an RF signal generator having an RF frequency control input and an RF signal output at which an RF signal is produced;
    a fixed tuning circuit connected between said RF signal output and said RF signal applicator;
    a sensor coupled to at least one of or between (a) said RF signal applicator and (b) said RF signal output, and responsive to an RF parameter affecting plasma ion density measurable near one of or between (a) said RF signal applicator and (b) said RF signal output, wherein said parameter consists of one of:
    (a) a Fourier component of the magnitude of the RF current flow to said RF signal applicator,
    (b) the magnitude of the time rate of change in RF current flow to said RF signal anplicator;
    an RF signal magnitude servo responsive to said sensor and programmed to adjust a magnitude of said RF signal produced at said RF signal output of said RF signal generator so as to set said parameter at least near to a value corresponding to a desired plasma ion density value.

16. The reactor of claim 15 wherein said desired value of said parameter is one of a maximum or a minimum value.

17. The reactor of claim 15 wherein said RF signal magnitude servo adjusts the magnitude of one of the following generator parameters: delivered voltage, delivered current, delivered power, reflected power, time rate of change of current, product of current and voltage, a Fourier component of the voltage, a phase angle between the voltage and current, a phase angle between any two RF generator parameters.

18. In an RF plasma reactor comprising a reactor chamber with a process gas inlets said reactor chamber for containing a workpiece to be processed, an RF signal applicator facing a portion of the interior of said chamber; an RF signal generator having an RF frequency control input and an RF signal output at which an RF signal is produced, a method of tuning said RF signal output to said RF signal applicator, comprising:
  selecting a desired plasma ion density value;
  providing a fixed tuning circuit connected between said RF signal output and said RF signal applicator;
  sensing an RF parameter affecting plasma ion density measurable near one of or between (a) said RF signal applicator and (b) said RF signal output, wherein said parameter consists of one of:
    (a) a Fourier component of the magnitude of the RF current flow to said RF signal applicator,
    (b) the magnitude of the time rate of chance in RF current flow to said RF signal applicator; and
  in response to said sensor, adjusting a magnitude of said RF signal produced at said RF signal output of said RF signal generator so as to optimize said parameter to a value corresponding to said desired plasma ion density value.

19. The method of claim 18 wherein said desired value of said parameter is one of a maximum or a minimum value.

20. The method of claim 18 wherein said adjusting adjusts the magnitude of one of the following generator parameters: delivered voltage, delivered current, delivered power, reflected power, time rate of change of current, product of current and voltage, a Fourier component of the voltage, a phase angle between the voltage and current, a phase angle between any two RF generator parameters.

21. In an RF plasma reactor comprising a reactor chamber with a process gas inlet, said reactor chamber for containing a workpiece to be processed, an RF signal applicator facing a portion of the interior of said chamber, and an RF signal generator having a controllable RF frequency and an RF signal output coupled to an input of said RF signal applicator, a tuning method comprising:
  sensing a parameter related to an RF voltage of said workpiece;
  adjusting said frequency of said RF signal generator within a frequency range so as to optimize said parameter to one of a maximum or minimum value within said frequency range.

22. The method of claim 21 wherein said RF signal applicator is a capacitive electrode.

23. The method of claim 21 wherein said reactor further comprises a workpiece support inside said chamber and said RF signal generator is coupled to said workpiece support, whereby said RF signal applicator comprises said workpiece support.

24. The method of claim 21 further comprising providing a fixed tuning circuit between said RF signal generator and said RF signal applicator.

25. The method of claim 21 wherein said parameter comprises a Fourier component of the RF voltage of said RF signal applicator.

26. The method of claim 25 wherein said Fourier component comprises one of: (a) a first harmonic, (b) a second harmonic, (c) a D.C. component.

27. The method of claim 21 wherein said bias RF signal generator has a bias RF signal output level which is adjustable, said method further comprising:
  varying said RF signal output level so as to at least nearly set and maintain the magnitude of said parameter at a desired set point.

28. The method of claim 21 further comprising providing a transformer between said RF signal generator and said RF signal applicator.

29. The method of claim 28 wherein said transformer has a transformer ratio corresponding to an anticipated ratio between magnitudes of said load impedance at said input of said RF signal applicator and said output impedance of said RF signal generator.

30. The method of claim 21 further comprising:
  providing transformer apparatus having plural selectable transformer ratios between said RF signal generator and said RF signal applicator; and
  selecting one of said ratios best corresponding to an anticipated ratio between magnitudes of said load impedance at said input of said RF signal applicator and said output impedance of said RF signal generator.

31. An RF plasma reactor comprising:
  a reactor chamber with a process gas inlet;
  a workpiece support inside said chamber;
  an RF signal applicator facing a portion of the interior of said chamber overlying said support;
  an RF signal generator having a frequency control input, a controllable output power and an RF signal output coupled to an input of said RF signal applicator;
  a sensor coupled to a current path to said RF signal applicator, said sensor being responsive to a parameter affecting plasma ion density related to RF current flow in said RF signal applicator, wherein said parameter consists of one of:
    (a) a Fourier component of the magnitude of the RF current flow to said RF signal applicator,
    (b) the magnitude of the time rate of chancre in RF current flow to said RF signal applicator;
  a frequency servo connected to said frequency control input, said frequency servo being programmed to adjust said frequency of said RF signal generator within a frequency range so as to at least nearly optimize said parameter to a value corresponding to a desired plasma ion density value; and
  a power servo connected to said RF signal generator capable of changing said output power.

32. The reactor of claim 31 further comprising a fixed tuning circuit between said RF signal generator and said RF signal applicator.

33. The reactor of claim 31 further comprising:
  transformer apparatus having plural selectable transformer ratios between said RF signal generator and said RF signal applicator; and
  at least one of said ratios best corresponding to an anticipated ratio between magnitudes of said load impedance at said input of said RF signal applicator and said output impedance of said RF signal generator.

34. The reactor of claim 33 wherein said transformer apparatus comprises:

plural transformer windings corresponding to respective ones of said plural transformer ratios;

plural RF switches connecting respective ones of said transformer windings to said RF signal applicator.

35. The reactor of claim 34 wherein said plural transformer windings are secondary windings, said transformer apparatus further comprising a primary winding coupled to said RF signal generator.

36. The reactor of claim 31 further comprising a transformer between said RF signal generator and said RF signal applicator.

37. The reactor of claim 36 wherein said transformer has a transformer ratio corresponding to an anticipated ratio between magnitudes of said load impedance at said input of said RF signal applicator and said output impedance of said RF signal generator.

38. The reactor of claim 31 wherein said RF signal applicator comprises a capacitive electrode adjacent said reactor chamber and said RF signal generator furnishes RF plasma source signal.

39. The reactor of claim 31 wherein said RF signal applicator comprises an inductive coil antenna adjacent said reactor chamber and said RF signal generator furnishes RF plasma source signal.

40. The reactor of claim 31 further comprising:

a bias RF signal generator having an RF bias frequency control input and a bias signal output coupled to said workpiece support;

a sensor responsive to a bias signal parameter related to a voltage of said workpiece relative to RF ground;

a bias frequency servo programmed to adjust said frequency within a bias frequency range of said bias RF signal generator so as to optimize said bias signal parameter to one of a maximum or minimum within said bias frequency range.

41. The reactor of claim 40 further comprising a fixed tuning circuit between said bias RF signal generator and said wafer support.

42. The reactor of claim 40 wherein said bias signal parameter comprises a Fourier component of the voltage of said workpiece.

43. The reactor of claim 40 further comprising:

bias transformer apparatus having plural selectable bias transformer ratios between said bias RF signal generator and said wafer support; and at least one of said bias ratios best corresponding to an anticipated ratio between magnitudes of said bias load impedance at said wafer support and said output impedance of said bias RF signal generator.

44. The reactor of claim 40 wherein said bias RF signal generator comprises bias RF signal level control input, said reactor further comprising:

a bias signal servo connected to said sensor and programmed to vary said bias RF signal output level so as to set said bias parameter to at least near a desired set point.

45. The reactor of claim 40 further comprising a bias transformer between said bias RF signal generator and said wafer support.

46. The reactor of claim 45 wherein said bias transformer has a bias transformer ratio corresponding to an anticipated ratio between magnitudes of said bias load impedance at said wafer support and said output impedance of said bias RF signal generator.

47. In an RF plasma reactor comprising a reactor chamber with a process gas inlet, a workpiece support, an RF signal applicator facing a portion of the interior of said chamber, an RF signal generator having a controllable RF frequency and a controllable output power, and an RF signal output coupled to an input of said RF signal applicator, a method for tuning said RF signal generator to said RF signal applicator, comprising:

selecting a desired plasma ion density value;

measuring, near one of or between (a) the output of said signal generator and (b) at said signal applicator, a first RF generator parameter affecting plasma ion density, wherein said parameter consists of one of:
(a) a Fourier component of the magnitude of the RF current flow to said RF signal applicator,
(b) the magnitude of the time rate of change in RF current flow to said RF signal applicator;

adjusting said frequency of said RF signal generator so as to at least nearly optimize said RF generator parameter near an optimum value corresponding to said desired plasma ion density value; and adjusting said output power so as to maintain said RP generator parameter near said optimum value.

48. The method of claim 47 further comprising:

measuring, near one of or between (a) the output of said signal generator and (b) at said signal applicator, second and third RF generator parameters affecting plasma ion density;

adjusting said second RF generator parameter so as to at least nearly optimize said third RF generator parameter to a value corresponding to said desired plasma ion density value.

49. The method of claim 48 wherein at least one of said first, second and third RF generator parameters is different from the other two.

50. The method of claim 48 wherein each of said first, second and third RF generator parameters is different from each of the others.

51. The method of claim 48 wherein said first, second and third RF generator parameters are the same RF generator parameter.

52. The method of claim 47 wherein said signal applicator comprises an RF source signal applicator.

53. The method of claim 52 wherein said reactor further comprises a bias signal applicator and a bias RF signal generator coupled to said bias signal applicator, said method further comprising:

measuring, near one of or between (a) the output of said bias signal generator and (b) at said bias signal applicator, a fourth RF generator parameter;

adjusting said frequency of said bias signal generator within a certain frequency range so as to at least nearly optimize said fourth RF generator parameter to one of a maximum or minimum value within said frequency range.

54. The method of claim 53 further comprising:

measuring, near one of or between (a) the output of said bias signal generator and (b) at said bias signal applicator, fifth and sixth RF generator parameters;

adjusting said fifth RF generator parameter of said bias signal generator so at to at least nearly optimize said sixth RF generator parameter with respect to a desired value thereof.

55. The method of claim 54 wherein said fourth, fifth and sixth RF generator parameters are the same RF generator parameter.

56. The method of claim 54 wherein at least one of said fourth, fifth and sixth RF generator parameters is different from the other two.

57. The method of claim 54 wherein said fourth, fifth and sixth RF generator parameters are each selected from among the following RF generator parameters:
  delivered voltage, delivered current, delivered power, reflected power, time rate of change of current, a Fourier component of the voltage, a phase angle between the voltage and current, a phase angle between any two RF generator parameters.

58. The method of claim 47 wherein said signal applicator comprises an RF bias signal applicator.

59. An RF plasma reactor comprising:
  a reactor chamber with a process gas inlet, said reactor chamber for containing a workpiece to be processed;
  an RF signal applicator facing a portion of the interior of said chamber;
  an RF signal generator having an RF frequency control input, a controllable output power and an RF signal output coupled to an input of said RF signal applicator;
  a sensor coupled to said RF signal applicator and responsive to a parameter affecting plasma ion density related to an RF voltage of said RF signal applicator;
  a frequency servo responsive to said sensor and programmed to adjust said frequency of said RF signal generator within a frequency range so as to optimize said parameter to a value corresponding to a desired plasma ion density value;
  a power servo connected to said RF signal generator that can adjust said output power; and
  a workpiece support inside said chamber wherein said RF signal generator is coupled to said workpiece support, whereby said RF signal applicator comprises said workpiece support.

60. The reactor of claim 59 further comprising a fixed tuning circuit between said RF signal generator and said RF signal applicator.

61. The reactor of claim 59 wherein said parameter comprises a Fourier component of the RF voltage of said RF signal applicator.

62. The reactor of claim 61 wherein said Fourier component comprises one of: (a) a first harmonic, (b) a second harmonic, (c) a D.C. component.

63. The reactor of claim 59 wherein said RF signal generator has an RF signal level control input, said reactor further comprising:
  a signal servo connected to said signal control input and programmed to vary said RF signal output level so as to set and maintain said parameter at least near a desired set point.

64. The reactor of claim 59 further comprising a transformer between said RF signal generator and said RF signal applicator.

65. The reactor of claim 64 wherein said transformer has a transformer ratio corresponding to an anticipated ratio between magnitudes of said load impedance at said input of said RF signal applicator and said output impedance of said RF signal generator.

66. The reactor of claim 59 further comprising:
  a transformer apparatus having plural selectable transformer ratios between said RF signal generator and said RF signal applicator; and
  at least one of said ratios best corresponding to an anticipated ratio between magnitudes of said load impedance at said input of said RF signal applicator and said output impedance of said RF signal generator.

67. The reactor of claim 59 wherein said RF signal applicator is a capacitive electrode.

68. An RF plasma reactor comprising:
  a reactor chamber with a process gas inlet;
  a workpiece support inside said chamber;
  an RF signal applicator facing a portion of the interior of said chamber overlying said support;
  an RF signal generator having a frequency control input and an RF signal output coupled to an input of said RF signal applicator;
  a sensor coupled to a current path to said RF signal applicator, said sensor being responsive to a parameter related to RF current flow in said RF signal applicator;
  a frequency servo connected to said frequency control input, said frequency servo being programmed to adjust said frequency of said RF signal generator within a frequency range so as to at least nearly optimize said parameter to one of a maximum or minimum value within said frequency range
  transformer apparatus having plural selectable transformer ratios between said RF signal generator and said RF signal applicator, said transformer apparatus comprising:
    plural transformer windings corresponding to respective ones of said plural transformer ratios said plural transformer windings comprising a multi-filar transmission line transformer
    plural RF switches connecting respective ones of said transformer windings to said RF signal applicator;
  at least one of said ratios best corresponding to an anticipated ratio between magnitudes of said load impedance at said input of said RF signal applicator and said output impedance of said RF signal generator.

69. An RF plasma reactor comprising:
  a reactor chamber with a process gas inlet;
  a workpiece support inside said chamber;
  an RF signal applicator facing a portion of the interior of said chamber overlying said support;
  an RF signal generator having a frequency control input and an RF signal output coupled to an input of said RF signal applicator;
  a sensor coupled to a current path to said RF signal applicator, said sensor being responsive to a parameter related to RF current flow in said RF signal applicator;
  a frequency servo connected to said frequency control input, said frequency servo being programmed to adjust said frequency of said RF signal generator within a frequency range so as to at least nearly optimize said parameter to one of a maximum or minimum value within said frequency range
  a bias RF signal generator having an RF bias frequency control input and a bias signal output coupled to said workpiece support;
  a sensor responsive to a bias signal parameter related to a voltage of said workpiece relative to RF ground;
  a bias frequency servo programmed to adjust said frequency within a bias frequency range of said bias RF signal generator so as to optimize said bias signal parameter to one of a maximum or minimum within said bias frequency range; and
  a bias transformer apparatus comprising:
    plural bias transformer windings corresponding to respective ones of said plural bias transformer ratios;
    plural bias RF switches connecting respective ones of said transformer windings to said workpiece support.

70. The reactor of claim 69 wherein said plural bias transformer windings are secondary bias windings, said bias transformer apparatus further comprising a primary bias winding coupled to said bias RF signal generator.

71. The reactor of claim 69 wherein said plural bias transformer windings comprise a multi-filar transmission line bias transformer.

72. In an RF plasma reactor comprising a reactor chamber with a process gas inlet, a workpiece support, an RF signal applicator facing a portion of the interior of said chamber, said signal applicator comprising an RF source signal applicator, an RF signal generator having a controllable RF frequency, an RF signal output coupled to an input of said RF signal applicator, a bias signal applicator and a bias RF signal generator coupled to said bias signal applicator, a method for tuning said RF signal generator to said RF signal applicator, comprising:

measuring, near one of or between (a) the output of said signal generator and (b) at said signal applicator, a first RF generator parameter;

adjusting said frequency of said RF signal generator within a certain frequency range so as to at least nearly optimize said RF generator parameter to one of a maximum or minimum value within said frequency range;

measuring, near one of or between (a) the output of said bias signal generator and (b) at said bias signal applicator, a fourth RF generator parameter;

adjusting said frequency of said bias signal generator within a certain frequency range so as to at least nearly optimize said fourth RF generator parameter to one of a maximum or minimum value within said frequency range;

measuring, near one of or between (a) the output of said bias signal generator and (b) at said bias signal applicator, fifth and sixth RF generator parameters;

adjusting said fifth RF generator parameter of said bias signal generator so at to at least nearly optimize said sixth RF generator parameter with respect to a desired value thereof;

wherein each of said fourth, fifth and sixth RF generator parameters is different from each of the others.

\* \* \* \* \*